(12) United States Patent
Mizukami

(10) Patent No.: US 12,319,059 B2
(45) Date of Patent: Jun. 3, 2025

(54) LIQUID DISCHARGE HEAD, LIQUID DISCHARGE DEVICE, LIQUID DISCHARGE APPARATUS

(71) Applicant: Ricoh Company, Ltd., Tokyo (JP)

(72) Inventor: Satoshi Mizukami, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 611 days.

(21) Appl. No.: 16/900,255

(22) Filed: Jun. 12, 2020

(65) Prior Publication Data
US 2020/0398569 A1    Dec. 24, 2020

(30) Foreign Application Priority Data

Jun. 20, 2019  (JP) ................. 2019-114739

(51) Int. Cl.
  *B41J 2/14*    (2006.01)
  *C23C 16/40*   (2006.01)
  *C23C 16/455*  (2006.01)

(52) U.S. Cl.
  CPC ......... *B41J 2/14201* (2013.01); *C23C 16/402* (2013.01); *C23C 16/405* (2013.01); *C23C 16/45525* (2013.01)

(58) Field of Classification Search
  CPC .............. C23C 16/402; C23C 16/405; C23C 16/45525; B41J 2/14201
  See application file for complete search history.

(56) References Cited

U.S. PATENT DOCUMENTS

| | | | |
|---|---|---|---|
| 5,659,346 A * | 8/1997 | Moynihan | B41J 2/1632 |
| | | | 347/88 |
| 9,385,298 B2 | 7/2016 | Mizukami et al. | |
| 9,463,623 B2 | 10/2016 | Takagi et al. | |
| 9,597,872 B2 | 3/2017 | Mizukami | |
| 9,627,606 B2 | 4/2017 | Mizukami | |
| 9,889,654 B2 | 2/2018 | Mizukami et al. | |
| 9,902,151 B2 | 2/2018 | Mizukami | |
| 9,950,524 B2 | 4/2018 | Shinkai et al. | |
| 9,956,774 B2 | 5/2018 | Mizukami | |
| 9,969,161 B2 | 5/2018 | Shinkai et al. | |
| 9,987,843 B2 | 6/2018 | Mizukami | |
| 10,103,315 B2 | 10/2018 | Mizukami | |
| 10,112,391 B2 | 10/2018 | Mizukami | |
| 10,160,208 B2 | 12/2018 | Mizukami | |
| 10,239,312 B2 | 3/2019 | Mizukami | |
| 10,556,431 B2 | 2/2020 | Mizukami et al. | |
| 10,596,581 B2 | 3/2020 | Mizukami | |
| 10,723,130 B2 * | 7/2020 | Kuroda | B41J 2/161 |
| 10,926,540 B2 * | 2/2021 | Mizukami | B41J 2/1623 |
| 11,020,971 B2 * | 6/2021 | Minami | B41J 2/1642 |
| 2014/0267497 A1 * | 9/2014 | Takagi | B41J 2/14233 |
| | | | 347/45 |

(Continued)

OTHER PUBLICATIONS

JP 20003-311974 machine translation (Year: 2003).*

*Primary Examiner* — Jethro M. Pence
(74) *Attorney, Agent, or Firm* — XSENSUS LLP

(57) ABSTRACT

A liquid discharge head is provided that is used in a liquid discharge device. The liquid discharge head includes a flow path forming member that forms a liquid flow path, and a surface treatment film formed on a surface of the flow path forming member. An amount of carbon contained in the surface treatment film is 15 atomic % to 30 atomic %.

15 Claims, 14 Drawing Sheets

(56) References Cited

U.S. PATENT DOCUMENTS

2018/0033614 A1* 2/2018 Chandra .............. C23C 16/308
2019/0044055 A1   2/2019 Kondo et al.
2019/0176469 A1* 6/2019 Kuroda ................ B41J 2/1606
2020/0039227 A1* 2/2020 Mizukami ............. B41J 2/161

* cited by examiner

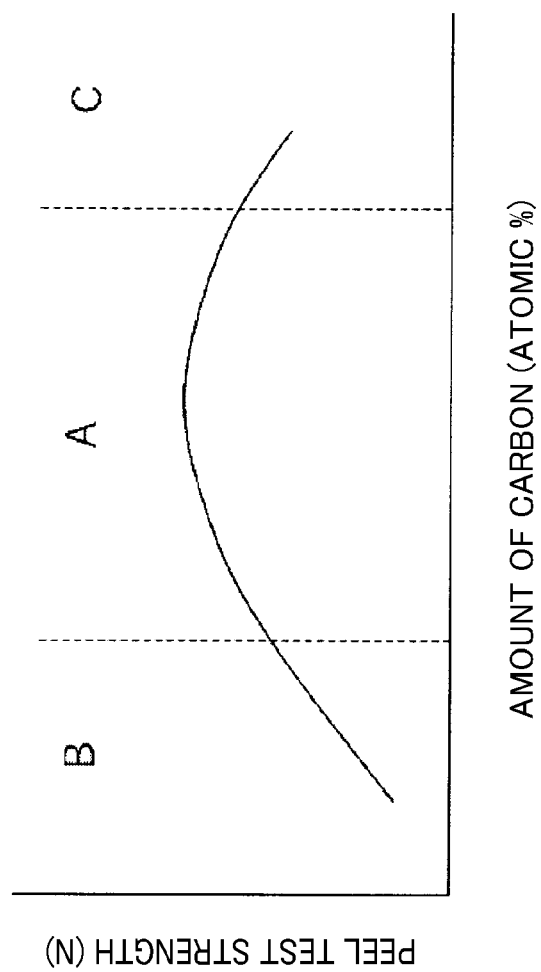

FIG. 8

| SiO₂ OCCUPIED AREA RATIO | CONTAINED ELEMENT at%(=mol%) | | | ADHESION STRENGTH |
|---|---|---|---|---|
| | Si | Ta | O | arb. |
| 0 | 0.0 | 28.6 | 71.4 | 10 |
| 10 | 2.4 | 26.5 | 71.1 | 13 |
| 20 | 4.9 | 24.3 | 70.7 | 18 |
| 30 | 7.6 | 22.0 | 70.3 | 20 |
| 40 | 10.5 | 19.5 | 69.9 | 25 |
| 50 | 13.7 | 16.9 | 69.5 | 30 |
| 60 | 17.0 | 14.0 | 69.0 | 40 |
| 70 | 20.6 | 10.9 | 68.5 | 80 |
| 80 | 24.5 | 7.6 | 67.9 | 90 |
| 90 | 28.7 | 3.9 | 67.3 | 91 |
| 100 | 33.3 | 0.0 | 66.7 | 91 |

LIQUID DISCHARGE HEAD, LIQUID DISCHARGE DEVICE, LIQUID DISCHARGE APPARATUS

CROSS-REFERENCE TO RELATED APPLICATION

This patent application is based on and claims priority pursuant to 35 U.S.C. § 119(a) to Japanese Patent Application No. 2019-114739, filed on Jun. 20, 2019 in the Japan Patent Office, the entire disclosure of which is hereby incorporated by reference herein.

BACKGROUND

Technical Field

The present disclosure relates to a liquid discharge head, a liquid discharge device, and a liquid discharge apparatus.

Related Art

In the industrial and commercial printing fields, a highly reliable liquid ejection head is required. In the liquid ejection head, a liquid flow path (for example, an ink flow path) is formed by bonding components forming a flow path (hereinafter, referred to as a "flow path forming member") with an adhesive.

In this case, although the bonding interface (interface) is a minute area, since it is exposed to ink, it is necessary to have a bonding function in which the flow path forming members are not separated from each other even in a liquid contact state in contact with the ink. Also, when a member that comes into contact with ink, such as a flow path forming member, elutes and expands with ink, for example, the droplet ejection characteristics (ejection characteristics) change significantly, and it becomes impossible to maintain good image quality. Therefore, it has been proposed to use a surface treatment film having ink resistance on the surface of the flow path forming member.

However, if the adhesion between the surface treatment film and the flow path forming member is reduced, the interface is peeled off, and the droplet ejection characteristics are greatly changed, so that good image quality cannot be maintained.

On the other hand, for example, the conventional art discloses that a surface treatment film is formed on the surface of a flow path forming member, the surface treatment film is an oxide film containing Si, and the oxide film containing a transition metal forming a passivation film in order to achieve both improvement in adhesiveness with an adhesive and improvement in liquid resistance.

SUMMARY

In an embodiment, a liquid discharge head is provided comprising: a flow path forming member that forms a liquid flow path, and a surface treatment film formed on a surface of the flow path forming member, wherein an amount of carbon contained in the surface treatment film is 15 atomic % to 30 atomic %.

In an embodiment, the surface treatment film is an oxide film containing Si, and an interface between the surface treatment film and the flow path forming member is siloxane bonded.

In an embodiment, the surface treatment film includes at least transition metal selected from the fourth group and the fifth group of the periodic table of elements.

In an embodiment, the surface treatment film includes at least one selected from Hf, Ta, and Zr.

In an embodiment, a film thickness of the surface treatment film is 30 nm or more and 70 nm or less.

In an embodiment, the liquid discharge head further includes an actuator substrate having an energy generator, and a nozzle substrate having nozzles, wherein the actuator substrate and the nozzle substrate comprise Si.

In an embodiment, the surface treatment film has a Ta—Si bonding.

In an embodiment, the liquid discharge head is included in a liquid discharge device.

In an embodiment, the liquid discharge device further includes at least one of: a head tank to store the liquid to be supplied to the liquid discharge head; a carriage to mount the liquid discharge head; a supply device to supply the liquid to the liquid discharge head; a maintenance device to maintain the liquid discharge head; and a drive device to move the carriage in a main scanning direction, together with the liquid discharge head to form a single unit.

In an embodiment, the amount of carbon contained in the surface treatment film is 18 atomic % to 27 atomic %.

In an embodiment, the surface treatment film was formed from an atomic layer deposition (ALD) process.

In an embodiment, the surface treatment film was formed in a low temperature region of 200° C.

In an embodiment, a method is provided of forming a surface treatment film on a surface of a flow path forming member of liquid discharge head, where the flow path member forms a liquid flow path, the method comprising, performing an atomic layer deposition (ALD) process to control an amount of carbon contained in the surface treatment film to be 15 atomic % to 30 atomic %.

In an embodiment, the method includes forming a $Ta_2O_5$ film in the first cycle on a surface of a head substrate made of a Si substrate; and forming a $SiO_2$ film in a second cycle.

In an embodiment, the surface treatment film is in a state in which the $Ta_2O_5$ film and the $SiO_2$ film are formed to coexist at an interface with the head substrate. In an embodiment, an occupied area ratio of the $SiO_2$ film at the interface between the surface treatment film and the head substrate is 70% or more, wherein the occupied area ratio is a value indicating the occupied area of $SiO_2$ as a percentage relative to the sum of the occupied area of $SiO_2$ and the occupied area of $Ta_2O_5$ in a vicinity of the interface between the surface treatment film and the head substrate.

BRIEF DESCRIPTION OF THE DRAWINGS

The aforementioned and other aspects, features, and advantages of the present disclosure will be better understood by reference to the following detailed description when considered in connection with the accompanying drawings, wherein:

FIG. 5 is an example of the relationship between the amount of carbon in the surface treatment film and the peel test strength;

FIG. 8 is a chart illustrating numerical values of an example of the relationship between an occupied area ratio of a $SiO_2$ film and the adhesion (adhesion strength) at an interface between the surface treatment film and a head substrate;

Figure 1:
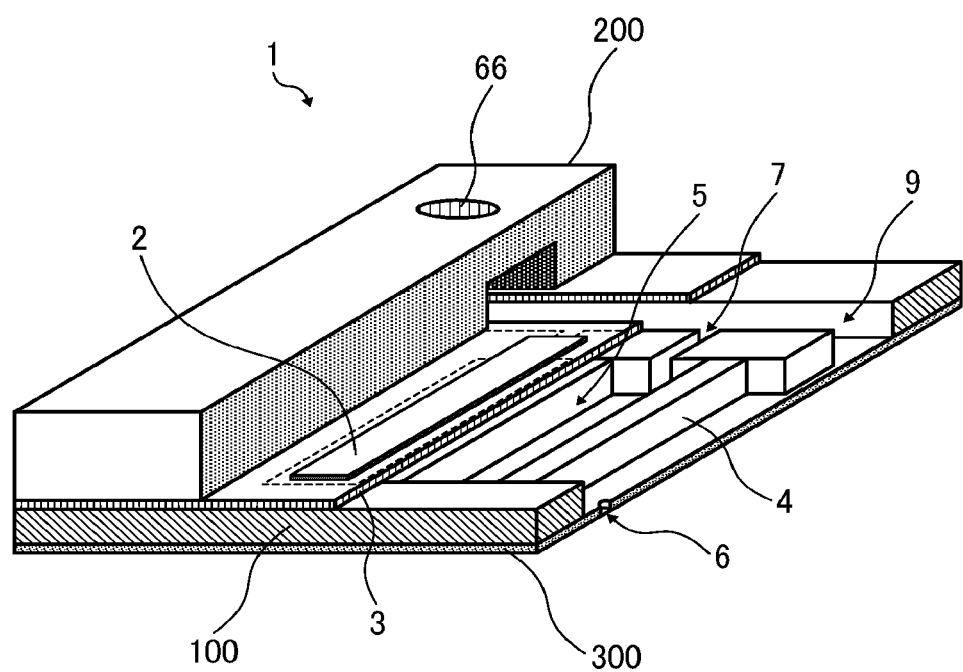
FIG. 1 is a perspective view of an example of a liquid discharge head according to the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in an analogous manner, and achieve similar results.

Although the embodiments are described with technical limitations with reference to the attached drawings, such description is not intended to limit the scope of the disclosure and all the components or elements described in the embodiments of this disclosure are not necessarily indispensable. As used herein, the singular forms "a", "an", and "the" are intended to include the plural forms as well, unless the context clearly indicates otherwise.

Hereinafter, a liquid discharge head, a liquid discharge device, a liquid discharge apparatus, and a method for manufacturing a liquid discharge head according to the present disclosure is described with reference to the drawings. Note that the present disclosure is not limited to the following embodiments and may be other embodiments. The following embodiments may be modified by, e.g., addition, modification, or omission within the scope that would be obvious to one skilled in the art. Any aspects having advantages as described for the following embodiments according to the present disclosure are included within the scope of the present disclosure.

A liquid discharge head according to the present disclosure includes a channel forming member to form a channel of liquid. The channel forming member is made of Si, and natural oxide film having a film thickness of 2 nm or more is formed on an outermost surface of the channel forming member. A surface treatment film is formed on and in contact with the natural oxide film.

[Liquid Discharge Head]

Figure 2:
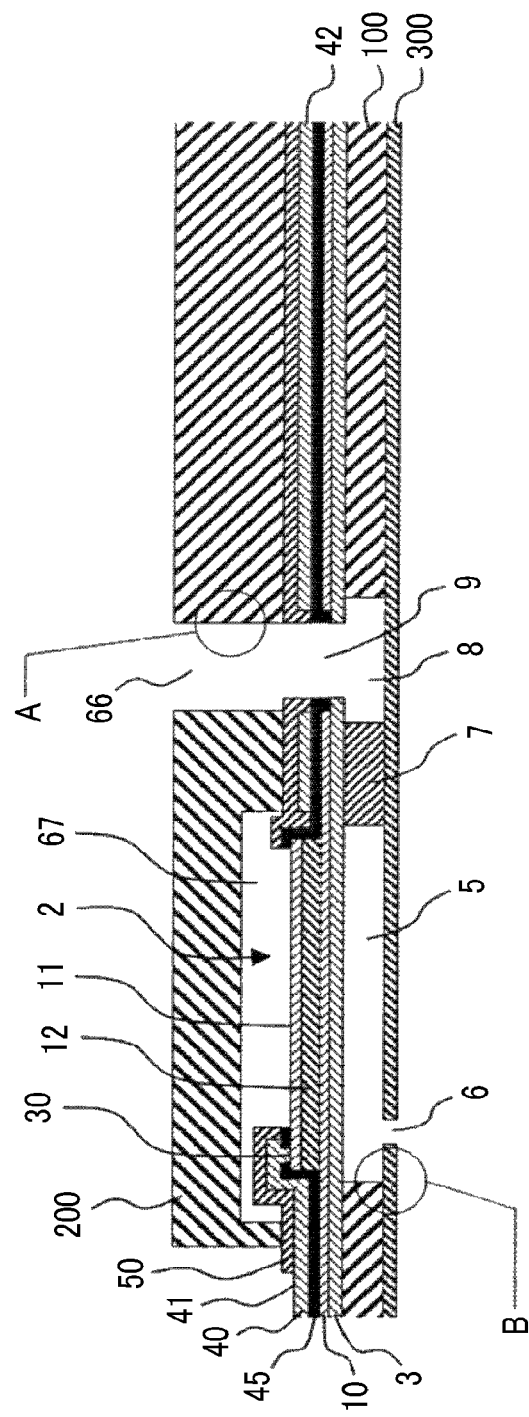
FIG. 2 is a cross-sectional view in a longitudinal direction of a liquid chamber in an example of the liquid discharge head according to the present disclosure.
Figure 3:
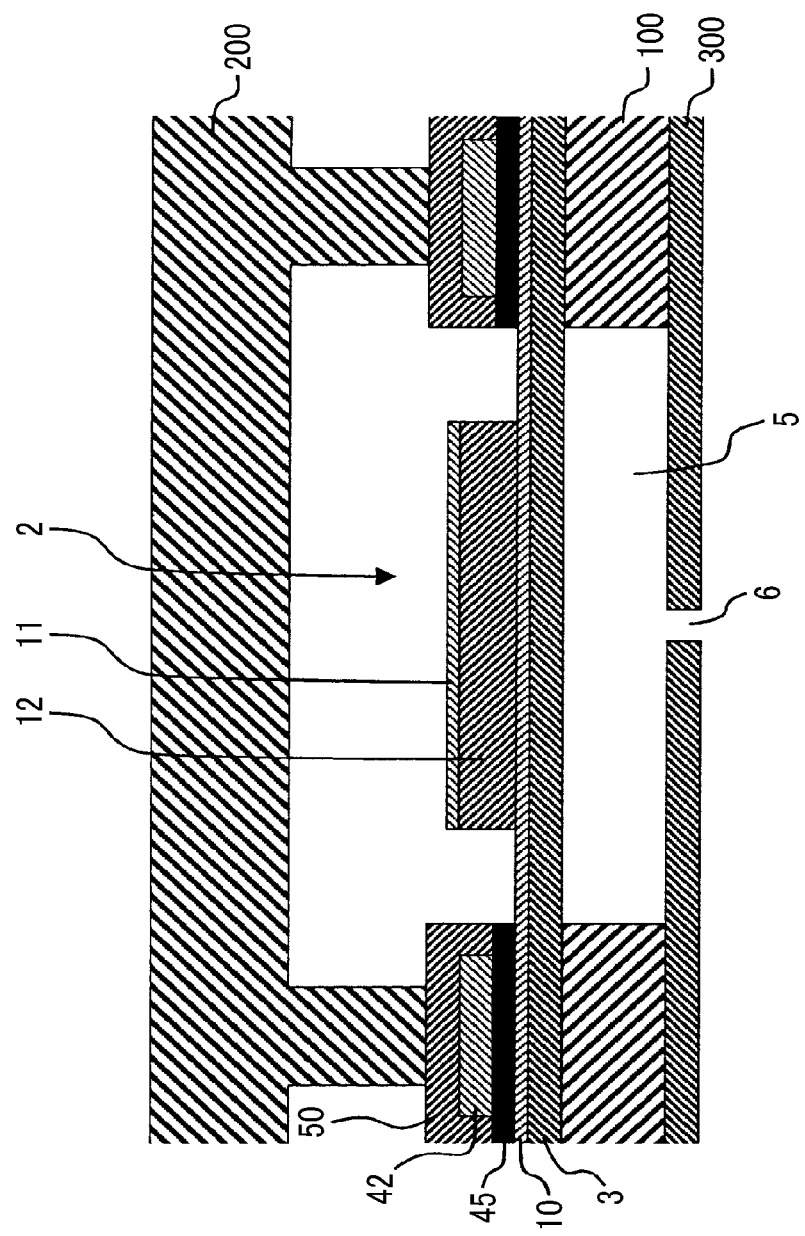
FIG. 3 is a cross-sectional view in a transverse direction of the liquid chamber in an example of the liquid discharge head according to the present disclosure.

A basic configuration of the liquid discharge head according to the present disclosure is described below. FIG. 1 is a perspective view of the liquid discharge head according to the present disclosure. FIG. 2 is a schematic cross-sectional view in a longitudinal direction of a liquid chamber in FIG. 1. FIG. 3 is a schematic cross-sectional view in a transverse direction of the liquid chamber in FIG. 1. The liquid discharge head according to the present disclosure includes a piezoelectric actuator.

The head 1 illustrated in FIGS. 1 to 3 is of a side-shooter type that discharges a liquid from nozzles formed in a surface of a substrate. The head 1 includes a piezoelectric element 2 (energy generator) to generate energy to discharge the liquid and a diaphragm 3 on an actuator substrate 100. A partition 4, a pressure chamber 5, a fluid restrictor 7, and a common chamber 8 are formed in the actuator substrate 100. Each pressure chamber 5 is partitioned by partitions 4.

The head substrate 200 includes a supply port 66, a common supply channel 9, and a gap 67. The supply port 66 and the common supply channel 9 supply the liquid to the head 1 from outside the head 1. As shown in FIG. 2, The gap 67 is formed in a head substrate 200 to enable the diaphragm 3 to bend. Further, nozzles 6 are formed in a nozzle substrate 300 at positions corresponding to the respective pressure chambers 5. A passivation film 50 is formed on the actuator substrate 100 to protect a lead-out wiring layer. The actuator substrate 100, the head substrate 200, and the nozzle substrate 300 are bonded to form the head 1.

As illustrated in FIGS. 1 and 2, the actuator substrate 100 includes the diaphragm 3, and the piezoelectric element 2. The diaphragm 3 forms a part of wall of the pressure chamber 5. The piezoelectric element 2 is disposed to face the pressure chamber 5 via the diaphragm 3. Further, the common supply channel 9 is formed in the diaphragm 3 at a position facing the common chamber 8, and the liquid can be supplied from outside the head 1 from the common supply channel 9 and the common chamber 8. As illustrated in FIG. 2, the piezoelectric element 2 formed on the side facing the pressure chamber 5 via the diaphragm 3 is configured of a common electrode 10, an individual electrode 11, and a piezoelectric body 12.

The head 1 configured as described above fills a liquid, for example, a recording liquid (ink) in each pressure chambers 5. The head 1 applies a pulse voltage of 20 V, for example, generated by an oscillation circuit to the piezoelectric body 12 via an individual electrode 11 corresponding to the nozzle 6 from which the liquid is to be discharged, through a lead wire 40 and a connection hole 30 formed in an interlayer insulating film 45 based on image data sent from a controller when each of the pressure chambers 5 is filled with the liquid.

Application of the pulse voltage makes the piezoelectric body 12 contracting in a direction parallel to the diaphragm 13 due to electro strictive effect, and the diaphragm 3 bends toward the pressure chamber 5. Thus, a pressure in the pressure chamber 5 rises sharply, and the recording liquid is discharged from the nozzles 6 communicating with the pressure chambers 5.

After the application of the pulse voltage, the contracted piezoelectric body 12 returns to an original position, and the bent (deflected) diaphragm 13 returns to an original position. Negative pressure lower than the pressure in the common chamber 8 is generated in the pressure chamber 5, and the ink outside the head 1 is supplied to the pressure chamber 5 through a supply port 66, the common supply channel 9, the common chamber 8, and the fluid restrictor 7 from outside the head 1.

Repeating the above-described processes, the head 1 can continuously discharge the liquid and forms an image on a recording medium (sheet) arranged opposite to the head 1.

Next, details of the head 1 according to the present disclosure is described while describing a method for manufacturing the head. The method for manufacturing the head 1 includes processes of: forming a natural oxide film 32 (see FIGS. 12 and 13) having a film thickness of 2 nm or more in the channel in the channel forming member 31, removing contaminants on a surface of the channel forming member 31, and forming a surface treatment film 52 (see FIGS. 4A and 4B, and FIGS. 12 and 13) on the natural oxide film 32. The method for manufacturing the head 1 may include other processes as needed.

Further, a channel forming member 31 is used to form a liquid channel. The head substrate 200, the actuator substrate 100, and the nozzle substrate 300 are one of the examples of the channel forming member 31.

First, the diaphragm 3 and the piezoelectric element 2 are formed on the actuator substrate 100 as illustrated in FIG. 2 and the like by a known method. Next, the interlayer insulating film 45, the connection hole 30, the wiring pattern 42, the lead wire 40, and the lead wiring pad 41 are formed by a known method.

Next, gaps 67 are formed in the head substrate 200, for example, by a photolithographic etching. A silicon substrate (Si substrate) is preferably used as the head substrate 200.

Next, the head substrate 200 and the actuator substrate 100 are bonded. The method of bonding the head substrate 200 and the actuator substrate 100 is not particularly limited, and may be appropriately changed.

Either the process of the actuator substrate 100 or the process of the head substrate 200 may be performed first in the above-described processes.

Next, the pressure chamber 5 is formed in the actuator substrate 100. An Inductive Coupled Plasma (ICP) etcher, for example, is used to form the pressure chamber 5 in the actuator substrate 100. Specifically, the actuator substrate 100 is processed by dry etching using carbon tetrafluoride gas ($CF_4$ gas), for example, to form the pressure chamber 5. However, the above-described process has a problem of carbon (C) and fluorine (F) remained as contaminants on the surface of the actuator substrate 100 after a formation of the pressure chamber 5.

If the contaminants are not sufficiently removed from the single crystal Si substrate, a formation of strong siloxane bonds (Si—O—Si bonds) in the channel forming member 31 and the surface treatment film is inhibited. Thus, the adhesion at the interface is reduced, and defects such as film peeling are likely to occur as a whole. Next, the surface treatment film 52 is formed on the natural oxide film 32 (see FIGS. 5 and 6). Formation of the surface treatment film 52 can secure liquid resistance of the channel forming member 31. Further, the surface treatment film 52 can prevent deterioration of the channel forming member 31 caused by contacting the liquid.

The surface treatment film 52 may be formed in a liquid channel in the channel forming member 31, that is, in a portion of the channel forming member 31 that may contact the liquid. The portion of the channel forming member 31 to form the surface treatment film 52 may be appropriately changed within a range in which liquid resistance can be secured.

Figure 4A:
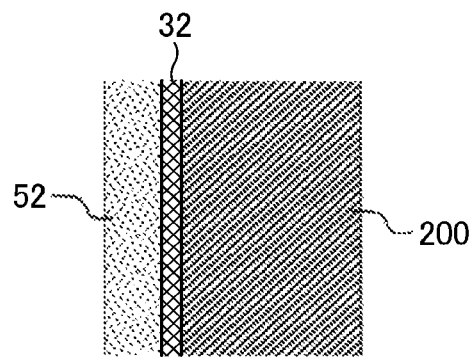
FIGS. 4A and 4B are partial enlarged views of an example of the liquid discharge head according to the present disclosure.

For example, the surface treatment film 52 may be formed on a surface of the supply port 66 of the head substrate 200, the common supply channel 9, the common chamber 8, the fluid restrictor 7, and the pressure chamber 5, both surfaces of the nozzle substrate 300 of the actuator substrate 100, and a surface of the nozzles 6, and the like. FIG. 4A is an enlarged schematic cross-sectional view of a region A in FIG. 2.

FIG. 4A illustrates that the surface treatment film 52 is formed in a portion of the supply port 66 of the head substrate 200 in contact with the liquid.

Figure 4B:
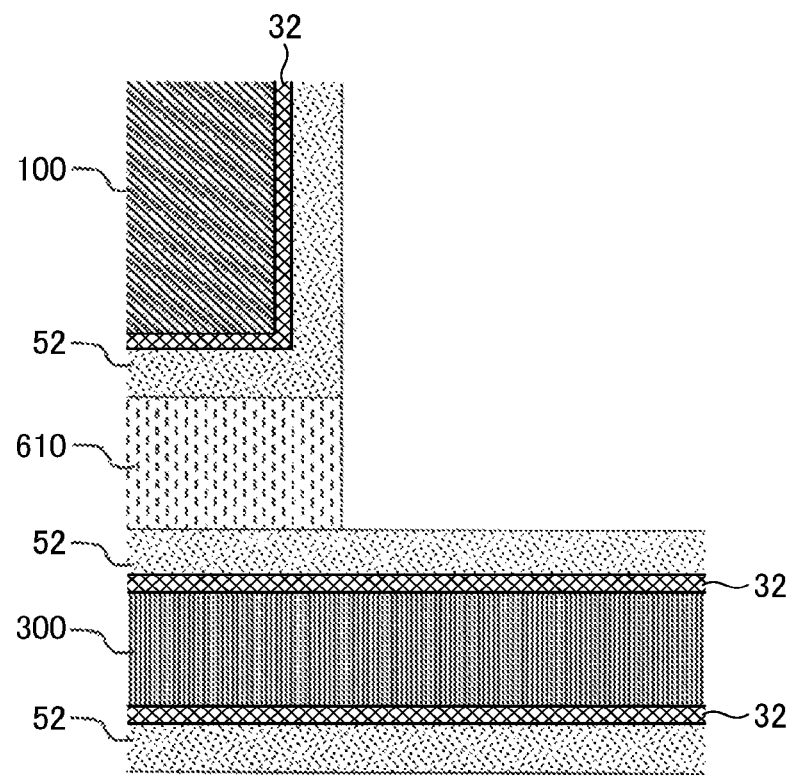

FIG. 4B is an enlarged schematic cross-sectional view of a region B in FIG. 2. In FIG. 4B, the surface treatment film 52 is formed on the surface of the actuator substrate 100 and the surface of the nozzle substrate 300. These substrates are bonded via an adhesive 610.

As described above, by forming the surface treatment film in the flow path of the liquid (for example, ink), the liquid resistance of the flow path forming member can be improved, and the deterioration of the flow path forming member can be further suppressed.

A surface of the head substrate 200 opposite to the actuator substrate 100 is protected with a support tape or the like to prevent formation of a film by the ALD method before the surface treatment film 52 is film-formed on the natural oxide film 32. Such protection with the support tape or the like also prevents a defect to occur such as a film formed by the ALD method is attached to the lead wiring pad 41 to hinder an electrical conduction of the lead wiring pad 41.

However, if the head substrate 200 to which the support tape or the like is attached is placed in the ALD chamber, contaminants such as carbon (C) is adhere to the surface of the channel forming member 31 due to influence of gas generated from the support tape. When the surface treatment film 52 is film-formed by the ALD method or the like in a state in which the contaminants such as C adhered on the channel forming member 31, the adhesion between the surface treatment film 52 and the channel forming member 31 is reduced.

In this embodiment, the amount of carbon contained in the surface treatment film is set to 15 atomic % to 30 atomic %. As a result of the study by the present inventors, it has been found that, when a surface treatment film is formed, carbon contained in the film remains without being decomposed depending on conditions such as a temperature at the time of film formation. And it was also found that the residual carbon in the surface treatment film affected the film stress of the surface treatment film.

FIG. 5 shows an example of the relationship between the amount of carbon in the surface-treated film and the peel test strength. The horizontal axis in this figure is the amount of carbon (atomic %) in the surface-treated film, and the vertical axis is the peel test strength (N). The peel test strength is one of index for determining the peel strength.

As shown in FIG. 5, the peel test strength increases as the amount of carbon during the surface treatment increases. However, beyond the peak, the peel test strength decreases as the amount of carbon during surface treatment increases. When the amount of carbon in the surface treatment film is within the range of the range A in FIG. 5, the peel test strength is at an acceptable.

Further, in the present embodiment, when the amount of carbon contained in the surface treatment film is within the range A, it becomes easy to suppress the occurrence of defects such as film peeling in the heat cycle test (HCT).

On the other hand, as shown in the range B, when the amount of carbon in the surface-treated film is smaller than a predetermined value, the peel test strength is not enough and film peeling occurs. When the amount of carbon in the surface treatment film is less than 15 atomic %, the film stress of the surface treatment film increases, and the peel strength in the peel test decreases. Also, in the temperature cycle test, defects such as film peeling are likely to occur.

Further, as shown in range C, when the amount of carbon in the surface treatment film is larger than a predetermined value, the peel test strength is not sufficient. Since the film density decreases as the amount of carbon in the surface treatment film increases, film peeling occurs when the amount of carbon in the surface treatment film exceeds 30 atomic %. In the range C, the resistance to ink immersion is also poor.

As described above, in the present embodiment, by setting the amount of carbon in the surface treatment film within the range A, the stress (internal stress, external stress) of the surface treatment film can be reduced, and peeling of the surface treatment film can be suppressed.

Further, according to the present embodiment, it is possible to suppress the surface treatment film from being peeled off by the influence of the temperature due to the transport environment and the use environment, and it is easy to maintain good liquid ejection characteristics.

Further, in the present embodiment, it is possible to prevent the surface treatment film from being peeled off due to the influence of the temperature due to the transport environment or the use environment, and to maintain good liquid ejection characteristics.

Further, the adhesion between the surface of the flow path forming member and the surface treatment film, the adhesion between the surface treatment film and the adhesive, the adhesion between the surface treatment film and the water repellent layer, and the like can be improved. Then, a high-quality head excellent in ejection stability and reliability can be obtained.

A method of film-formation of the surface treatment film 52 can be appropriately changed. For example, an atomic layer deposition (ALD) method, a sputtering method, a chemical vapor deposition (CVD) method, and the like may be used for film-formation. Among the above-described methods for film-formation, the ALD method is preferable from a viewpoint of the coatability. The ALD method can form a uniform film on an uneven surface. Thus, the ALD method is advantageous because the ALD method can form a uniform film on a complicated structure.

For example, by adjusting the film forming temperature of the surface treatment film, the amount of carbon contained in the surface treatment film can be set to 15 atomic % to 30 atomic %. The film formation temperature can be changed by changing a material, a film thickness, and the like used for forming the surface treatment film. For example, by forming a film in a low temperature region of 200° C. or less, the residual carbon can be set in the range A, and the internal stress can be suppressed to 300 MPa or less.

The residual carbon in the surface-treated film is derived, for example, from the precursor compound not sufficiently decomposed by heat.

In one example of the present embodiment, first, the substrate is subjected to $O_2$ plasma treatment before the formation of the surface treatment film, and then the carbon adhering to the surface of the flow path forming member is removed by polishing or etching the substrate surface. Next, an $O_3$ plasma treatment is further performed during the formation of the surface treatment film, and finally, a film is formed after removing contaminants. Thereby, the carbon content of the surface treatment film can be controlled in a desired range.

The amount of carbon contained in the surface treatment film is preferably 18 atomic % to 27 atomic %. In this range, peeling is further prevented, and the result of a heat cycle test and the result of ink immersion resistance are further improved.

The surface treatment film 52 is preferably an oxide film containing Si. Further, the interface between the surface treatment film 52 and channel forming member 31 (an interface) is preferably siloxane bonded. The siloxane bonding of the interface improves the adhesion of the surface treatment film 52. It can be determined that whether the interface between the surface treatment film 52 and the channel forming member 31 is siloxane bonded by Energy Dispersive X-ray spectroscopy (EDX) analysis or X-ray photoelectron spectroscopy (XPS) analysis, for example.

The surface treatment film 52 preferably contains at least one transition metal selected from the fourth group and fifth group. Thus, liquid resistance (ink resistance) of the surface treatment film 52 can be further improved. The surface treatment film 52 preferably contains at least one of Hf, Ta, and Zr among the transition metal selected from the fourth group and fifth group. Thus, the liquid resistance of the surface treatment film 52 can be further improved.

The thickness of the surface treatment film 52 is preferably 30 to 70 nm. In the thickness of the surface treatment film 52 is 30 nm or more, the surface treatment film 52 can secure enough ink resistance. If the thickness of the surface treatment film 52 is 70 nm or less, the surface treatment film 52 can reduce influence of stress and easily prevent an occurrence of film peeling at the interface between the channel forming member 31 and the surface treatment film 52. Further, also in the heat cycle test (HCT), it is possible to suppress the occurrence of defects due to film peeling or the like.

The actuator substrate and the nozzle plate are preferably made of the same material. By using the same material, stress due to external stress can be reduced, and the peel test strength can be further improved. In addition, the difference in linear expansion coefficient can be reduced, and the influence of stress on the surface treatment film can be further reduced. The actuator substrate and the nozzle plate preferably consist of Si.

The surface treatment film 52 preferably has a Ta—Si bonding state. The Ta—Si bonding state can further strengthen the bonding of the interface between the surface treatment film 52 and the channel forming member 31 and can further improve the adhesion of the surface treatment film 52. The binding state can be identified by X-ray Photoelectron Spectroscopy (XPS) analysis.

Next, a film formation state of a surface treatment film by the ALD method will be described with reference to FIGS. 6A to 7B. FIGS. 6A to 7B are schematic explanatory diagrams for explaining the same.

Figure 6A:
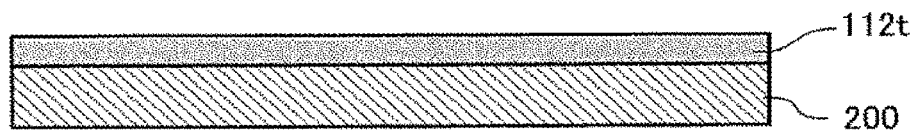
FIGS. 6A and 6B are schematic explanatory diagrams for explaining an ideal film formation state of a surface treatment film by the atomic layer deposition (ALD) method.
Figure 6B:
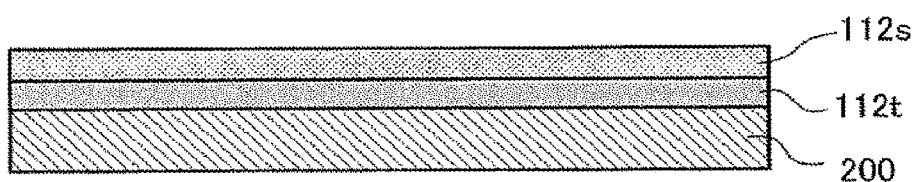

In the case of forming the surface treatment film 52 by the ALD method, it is possible to form a film digitally for each molecule by the ALD method. Therefore, as illustrated in FIG. 6A, a $Ta_2O_5$ film 112$t$ is formed in the first cycle on the surface of the head substrate 200 made of a Si substrate, and as illustrated in FIG. 6B, in the case of forming a $SiO_2$ film 112$s$ in the second cycle, it is ideal that the film is uniformly formed and stacked as a film for each molecular layer.

Figure 7A:
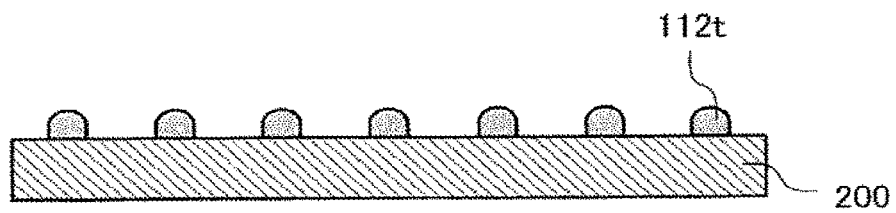
FIGS. 7A and 7B are schematic explanatory diagrams for explaining an actual film formation state of the surface treatment film by the ALD method.
Figure 7B:
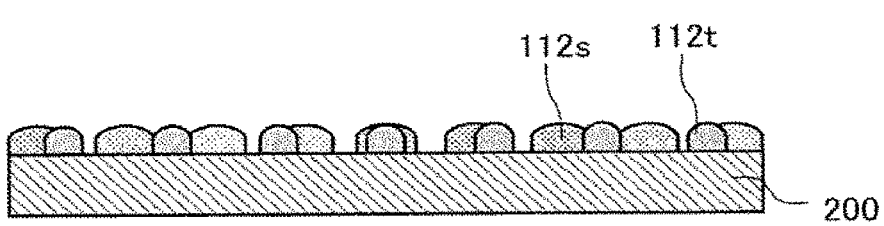

However, in practice, it has been found that the film is formed in an island shape instead of being uniform due to variations in surface energy and the like. That is, as illustrated in FIG. 7A, when a $Ta_2O_5$ film is formed in the first cycle on the surface of the head substrate 200, the $Ta_2O_5$ film is formed in an island shape, and as illustrated in FIG. 7B, when the $SiO_2$ film is formed in the second cycle, the $SiO_2$ film is also formed in an island shape, and a portion entering between the $Ta_2O_5$ films in the first cycle is generated.

Therefore, the surface treatment film 52 is in a state in which the $Ta_2O_5$ film 112$t$ and the $SiO_2$ film 112$s$ formed in an island shape coexist at the interface with the head substrate 200.

Here, the adhesion (adhesion strength) of the surface treatment film 52 to the head substrate 200 depends on the contact area ratio between the $Ta_2O_5$ film and the $SiO_2$ film at the interface between the surface treatment film 52 and the head substrate 200.

Therefore, the relationship between the occupied area ratio of the $SiO_2$ film at the interface between the head substrate 200 and the surface treatment film 52 and the adhesion (adhesion strength) at the interface between the head substrate 200 and the surface treatment film 52 will be described with reference to FIGS. 8 and 9. FIG. 8 is an explanatory chart illustrating numerical values of an example of the relationship, and FIG. 9 is an explanatory graph of FIG. 8.

Figure 9:
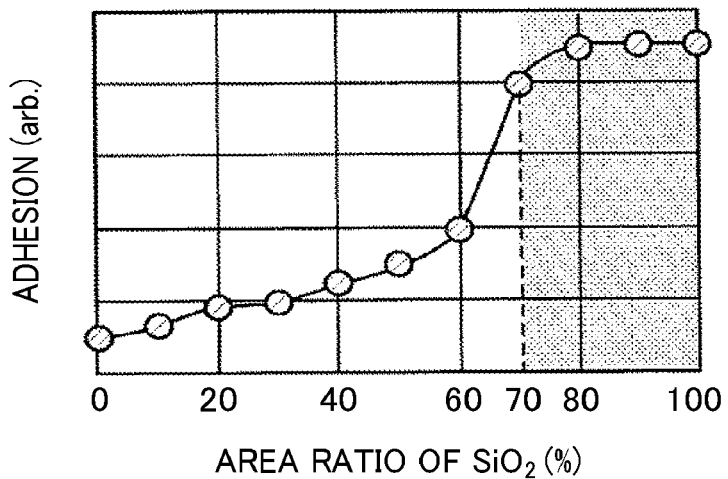
FIG. 9 is an explanatory graph of FIG. 8.

As seen from FIGS. 8 and 9, the adhesion of the surface treatment film 52 to the head substrate 200 depends on the contact area ratio between the $Ta_2O_5$ film and the $SiO_2$ film at the interface between the surface treatment film 52 and the head substrate 200. When the occupied area ratio of the $SiO_2$ film at the interface between the surface treatment film 52 and the head substrate 200 is 70% or more, the adhesion significantly increases.

Figure 10A:
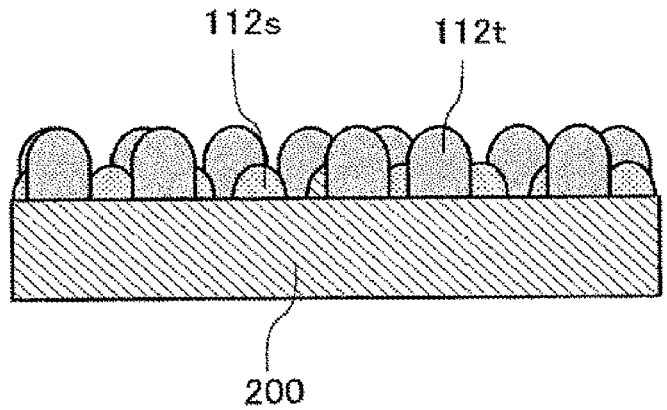
FIGS. 10A and 10B are explanatory diagrams illustrating a model of a difference in the occupied area ratio of the $SiO_2$ film at the interface between the surface treatment film and the head substrate.
Figure 10B:
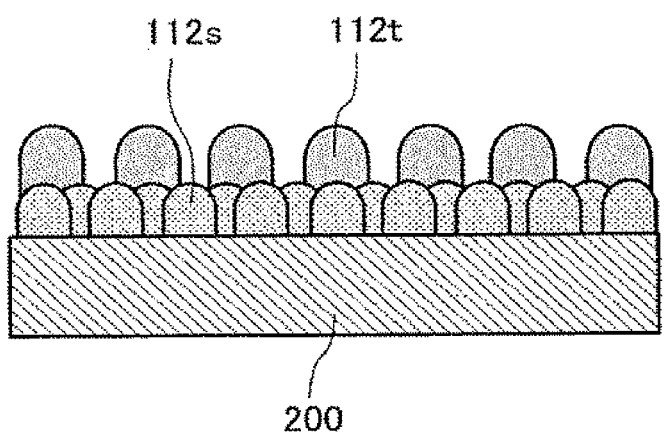
Figure 11:
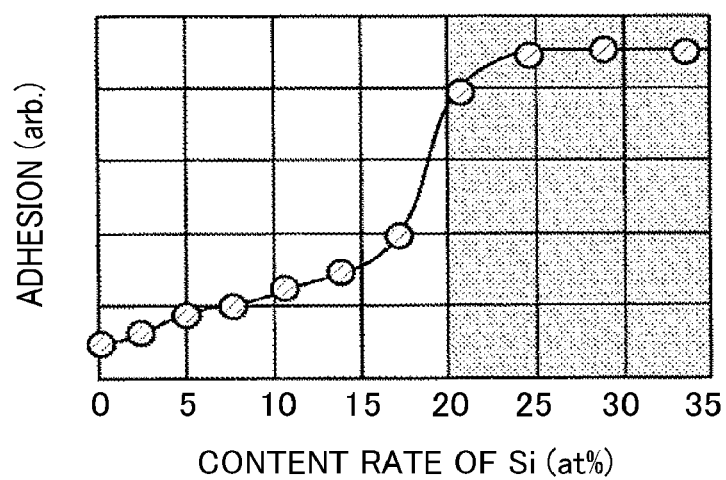
FIG. 11 is an explanatory graph of the relationship between the content of a contained element Si and the adhesion strength in FIG. 8.

Next, the relationship between the occupied area ratio of the $SiO_2$ film at the interface between the surface treatment film 52 and the head substrate 200, the content ratio of Si, and the adhesion will be described with reference to FIGS. 10A to 11. FIGS. 10A and 10B are explanatory diagrams illustrating a model of a difference in the occupied area ratio of the $SiO_2$ film at the interface between the surface treatment film 52 and the head substrate 200. FIG. 11 is an explanatory graph of the relationship between the content of a contained element Si and the adhesion strength in FIG. 8. As illustrated in FIG. 10A, when the occupied area ratio of the $SiO_2$ film 112$s$ of the surface treatment film 52 is low at the interface between the surface treatment film 52 and the head substrate 200, the Si content at the interface decreases. On the other hand, as illustrated in FIG. 10B, when the occupied area ratio of the $SiO_2$ film 112$s$ of the surface treatment film 52 is high at the interface between the surface treatment film 52 and the head substrate 200, the Si content at the interface increases.

The "content" is a value indicating the substance amount (mol) of Si relative to the substance amount of the sum of the substance amount of Si (mol), the substance amount of Ta (mol), and the substance amount of 0 (mol) as a percentage. The "occupied area ratio" is a value indicating the occupied area of $SiO_2$ as a percentage relative to the sum of the occupied area of $SiO_2$ and the occupied area of $Ta_2O_5$ in the vicinity of the interface between the surface treatment film and the head substrate.

Since the adhesion of $SiO_2$ to the head substrate 200 made of the Si substrate is higher than that of $Ta_2O_5$, as illustrated in FIG. 11, the Si content of the surface treatment film 52 at the interface with the head substrate 200 is increased, so that the adhesion is improved.

More specifically, referring to FIG. 11, until the Si content of the surface treatment film 52 at the interface with the head substrate 200 reaches about 20 at %, the adhesion is relatively low. However, when the content is 20 at % or more, the adhesion becomes high, and in particular, when the content is 25 at % or more, the adhesion is stabilized to high.

The content of Ta in the surface treatment film 52 at the interface with the head substrate 200 is preferably 10 at % or less.

Here, when the Si content is about 33 at %, only $SiO_2$ is in contact with the surface of the head substrate 200 ($SiO_2$ is 100%).

Therefore, referring to FIGS. 4 and 5, the Si content in the surface treatment film 52 in a natural oxide film 32 with the head substrate 200 is set to be 20% or more, so that adhesion of the surface treatment film 52 to the head substrate 200 improves, and it is possible to prevent the surface treatment film 52 from peeling from the head substrate 200.

On the other hand, the surface treatment film 52 requires the liquid resistance, so that the content of Si in the inside of the surface treatment film 52 is made smaller than the content (20 at % or more) in the natural oxide film 32. For example, the content of Si in the inside of the surface treatment film 52 is preferably in the range of about 10 to 15 at %. The content of Ta in the inside of the surface treatment film 52 is preferably 15 at % or more.

Here, in order to change the Si content of the surface treatment film 52 by the ALD method, normally, after a step of forming a $SiO_2$ film, a step of forming a $Ta_2O_5$ film is performed, and each film is alternately formed one step at a time. In the case of increasing the Si content, film formation of the $SiO_2$ film may be successively performed in a plurality of steps.

The Si content can be adjusted by changing the number of steps.

It is preferable that the region of the surface treatment film 52 in which the Si content is higher than the inside is set to be within the thickness range of 1 to 10 nm from the interface with the head substrate 200 because of the internal liquid resistance. In order to achieve both prevention of peeling and securing of liquid resistance of the surface treatment film 52, the Si content in the thickness range of about 5 nm (3 to 7 nm) from the interface with the head substrate 200 is preferably higher than the inside, and more preferably 20 at % or more.

In this way, the Si content is changed in the thickness direction of the surface treatment film 52, so that the ratio of Si in the surface treatment film 52 in the vicinity of the interface with the head substrate 200 is higher than that in the inside of the surface treatment film 52, and is 20 at % or more.

As a result, the adhesion with the head substrate 200 can be improved, peeling from the head substrate 200 can be prevented, and liquid resistance can also be improved.

Here, an example is described where the transition metal forming the passivation film included in the surface treatment film 52 is Ta. However, similar action and effect to those of the above embodiment can be obtained with a surface treatment film containing as the transition metal forming the passive film, Zr, other Fourth group or Fifth group transition metal.

Figure 12:
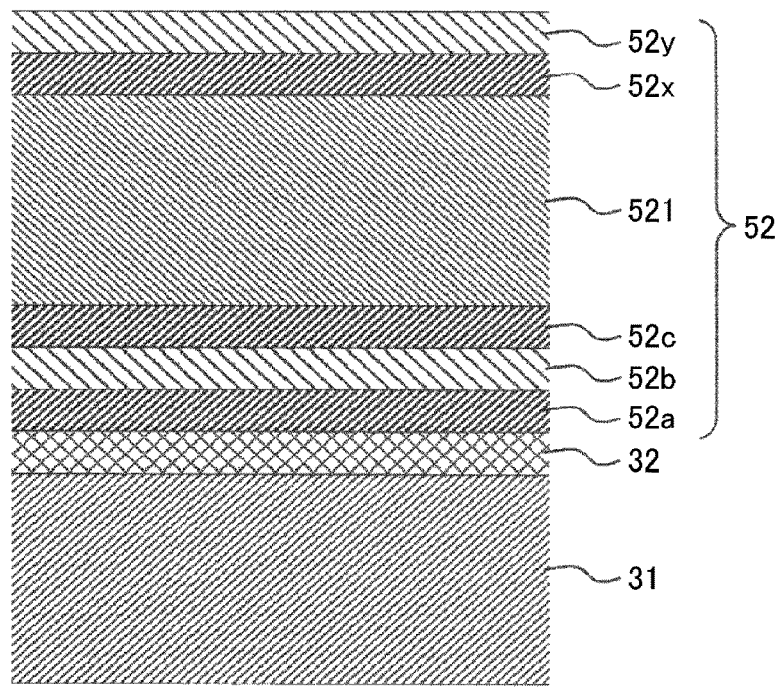
FIG. 12 is a cross-sectional view of an example of a surface treatment film.
Figure 13:
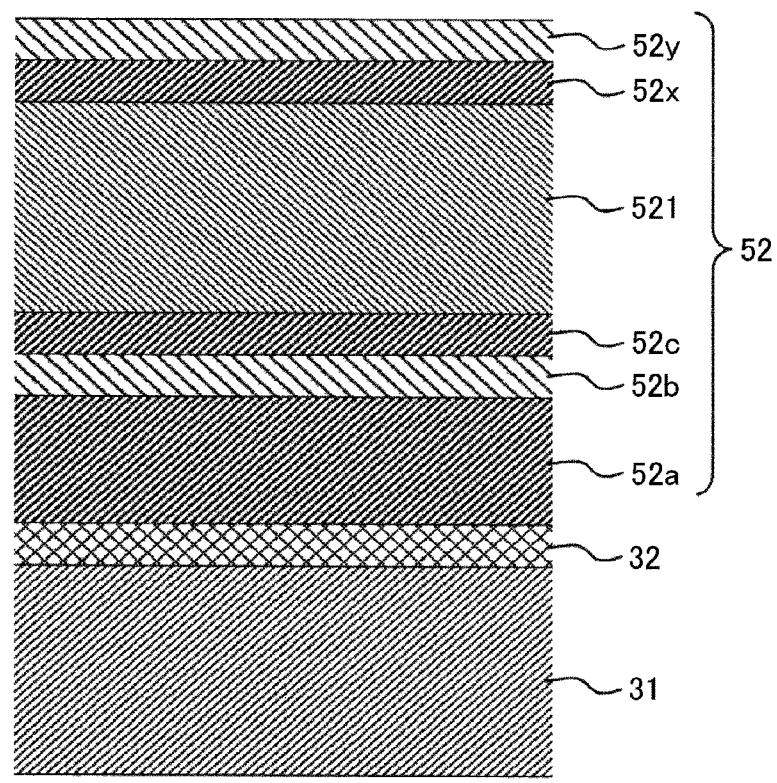
FIG. 13 is a cross-sectional view of another example of the surface treatment film.

Next, an example of the surface treatment film 52 is described below. FIGS. 12 and 13 are schematic cross-sectional views of an example of the surface treatment film 52. As illustrated in FIGS. 12 and 13, the natural oxide film 32 is formed on the outermost surface of the channel forming member 31, and the surface treatment film 52 is formed on the natural oxide film 32.

Following describes an example of the surface treatment film 52 in which a $SiO_2$ film and a $Ta_2O_5$ film are alternately formed (laminated) by the ALD method. It is preferable to form a $SiO_2$ film on a natural oxide film on the outermost surface of the flow path forming member which is a base of the surface treatment film 52. In this case, since a strong siloxane bond (Si—O—Si bond) is involved, the adhesion can be improved.

The film thickness of the first layer of $SiO_2$ film 52*a* is preferably from 0.1 to 10 nm, and is more preferably from 1 to 10 nm, and is still more preferably 2 to 4 nm. The first layer of $SiO_2$ film 52*a* having a film thickness within above-described range can strengthen the siloxane bond at the interface between the channel forming member 31 and the surface treatment film 52 and increase adhesion of the surface treatment film 52.

FIG. 12 is an example in which the film thickness of the first layer of $SiO_2$ film 52*a* is from 0.1 to 2 nm. FIG. 13 is an example in which the film thickness of the first layer of $SiO_2$ film 52*a* is from 2 to 4 nm.

The timing of forming the surface treatment film can be changed as appropriate. For example, the surface treatment film 52 may be formed after the actuator substrate 100 and the head substrate 200 are joined and the pressurized liquid chamber 5, the fluid resistance part 7, the common liquid chamber 8, and the like are formed.

Next, a surface treatment film is formed on the nozzle substrate 300 in which the nozzle holes 6 are formed in the same manner as described above. Note that this step may be performed before the above step. Then, it is bonded to the actuator substrate 100 obtained in the above step. The joining method can be performed by a known method. In this embodiment, this is performed using an adhesive.

Also, in the nozzle substrate 300 which is one of the flow path forming members, the surface treatment film 52 is formed in a region in contact with the liquid. In the present embodiment, the surface treatment film 52 is also formed on the ejection surface (the surface opposite to the actuator substrate 100) of the nozzle substrate 300, but the present invention is not limited to this.

[Liquid Discharge Device]

Figure 14:
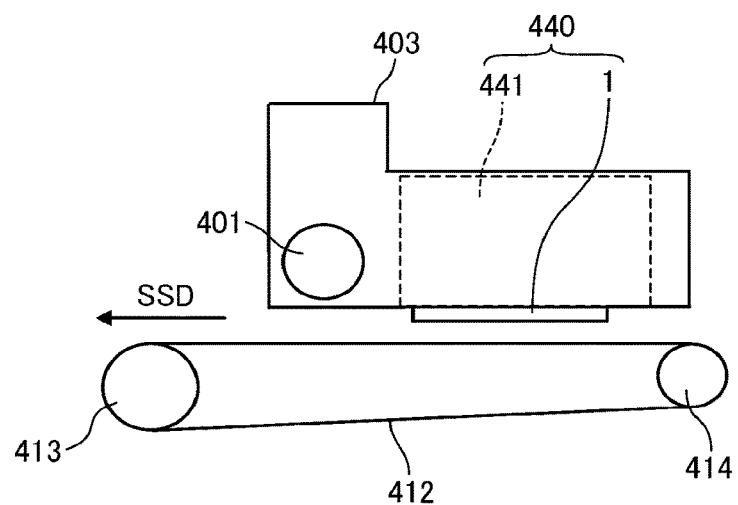
FIG. 14 is a schematic side view of an example of a liquid discharge device according to the present disclosure.
Figure 15:
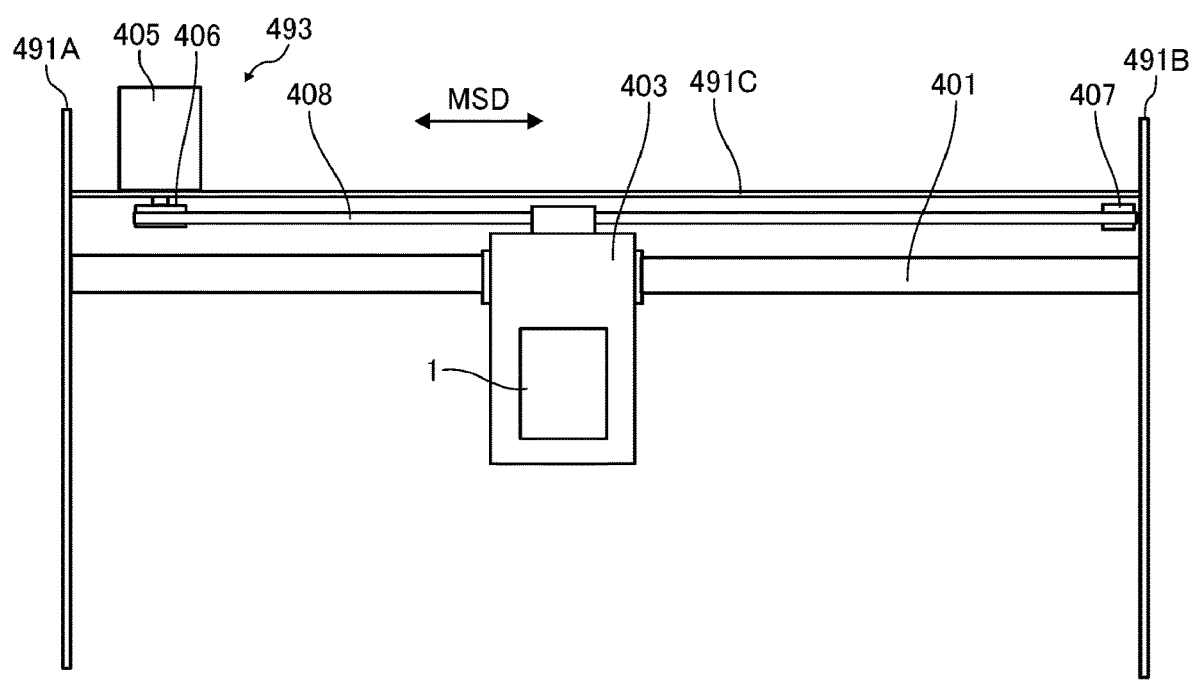
FIG. 15 is a schematic plan view of another example of the liquid discharge device according to the present disclosure.
Figure 16:
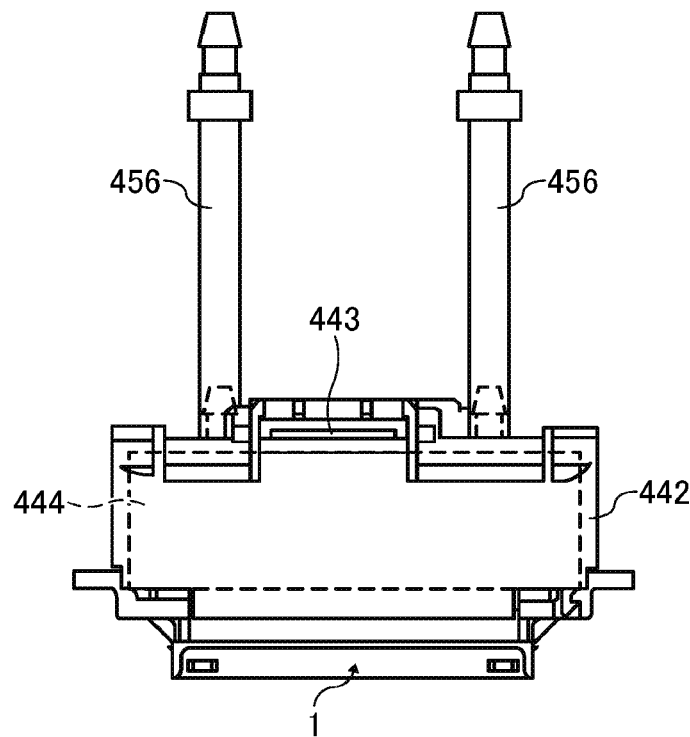
FIG. 16 is a schematic front view of still another example of the liquid discharge device according to the present disclosure.
Figure 17:
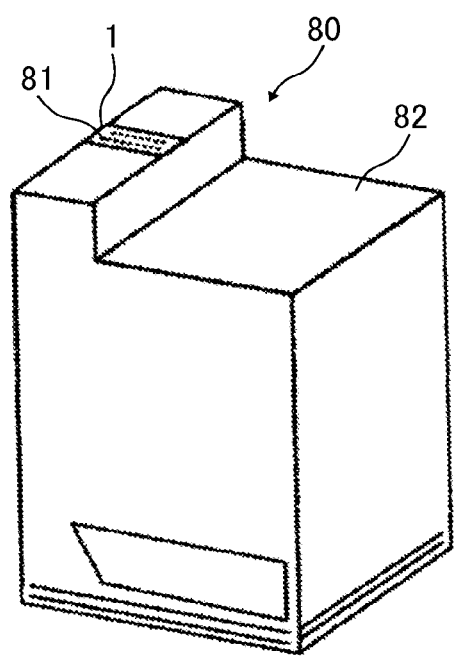
FIG. 17 is a perspective view of an example of a liquid cartridge.
Figure 18:
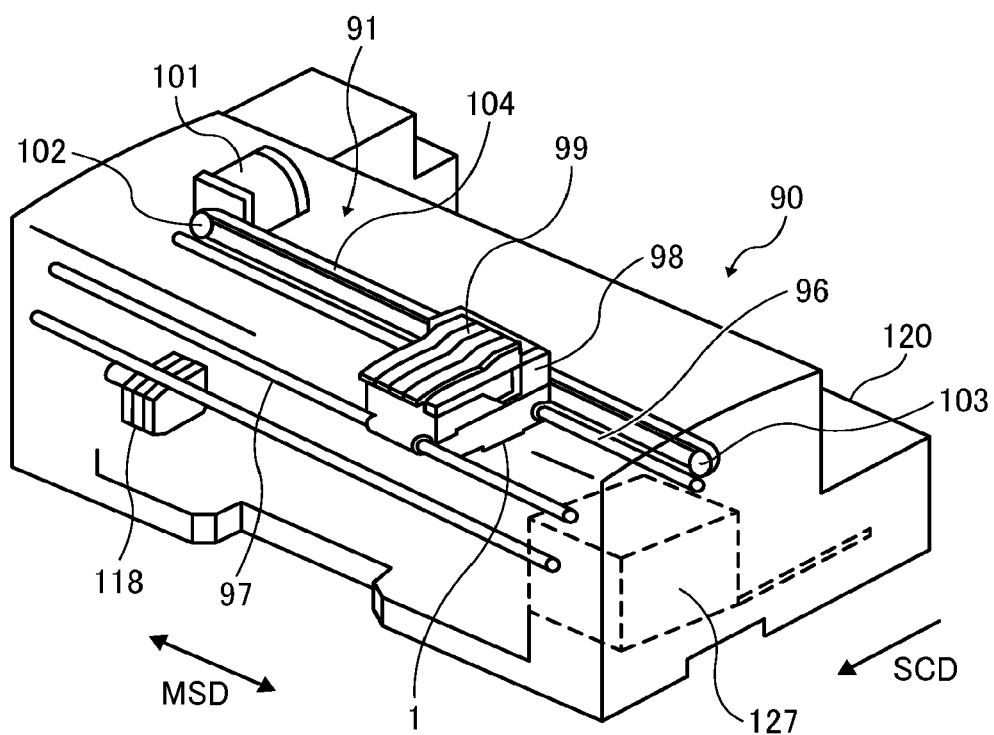
FIG. 18 is a perspective view of an example of a liquid discharging apparatus according to the present disclosure.
Figure 19:
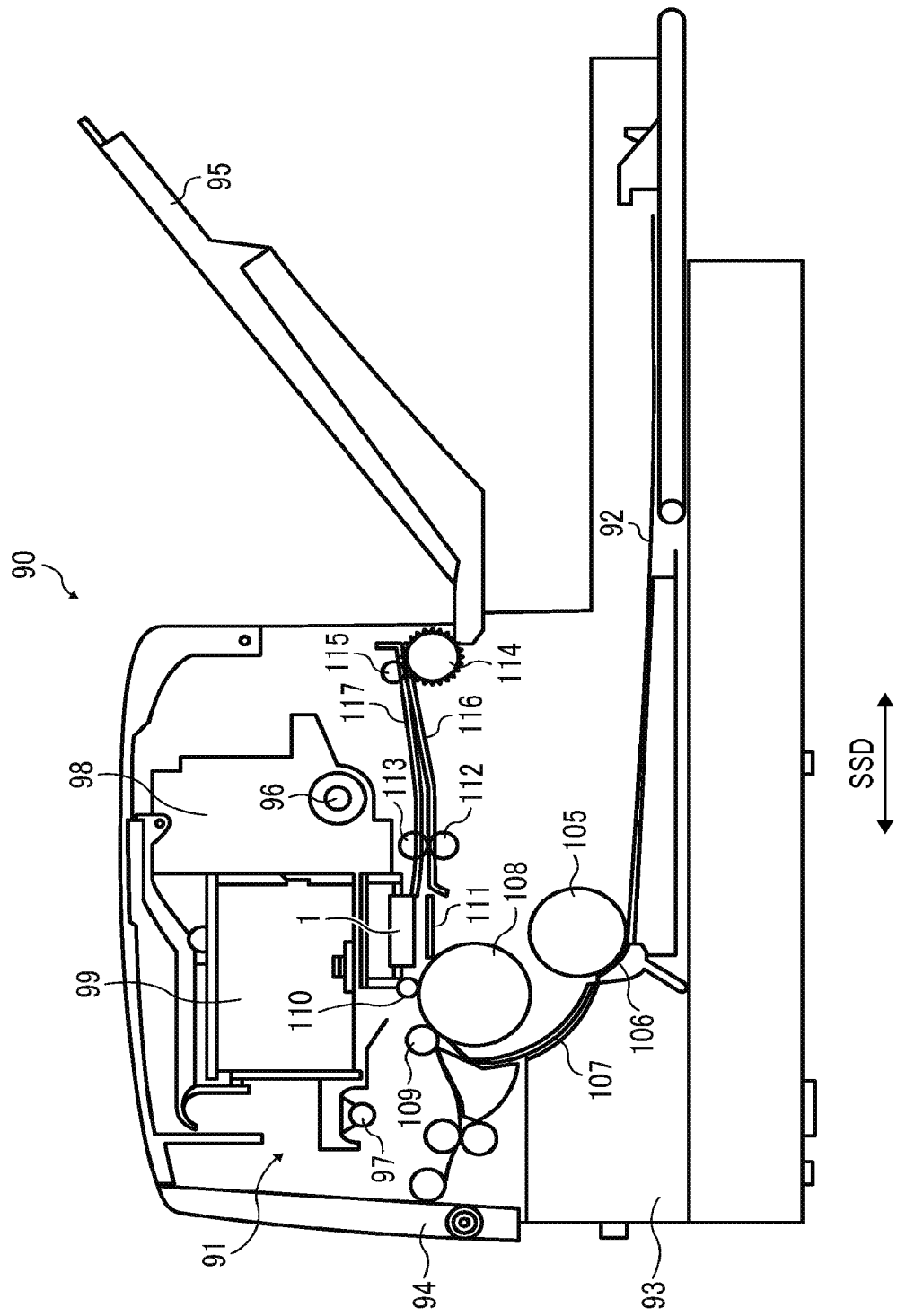
FIG. 19 is a side view of the example of the liquid discharging apparatus according to the present disclosure.

Next, the liquid discharge device 440 according to the present disclosure is described with reference to FIGS. 14 to 16. The carriage 403 mounts a liquid discharge device 440.

The head 1 according to the present disclosure and a head tank 441 forms the liquid discharge device 440 as a single unit. The head 1 is identical to the head 1 as illustrated in FIGS. 1 to 3.

The head 1 is identical to the head 1 as described above. The head 1 of the liquid discharge device 440 discharges liquid of each color, for example, yellow (Y), cyan (C), magenta (M), and black (K). The head 1 includes a nozzle array including a plurality of nozzles arrayed in row in a sub-scanning direction perpendicular to a main scanning direction indicated by arrow MSD in FIG. 9. The head 1 is mounted to the carriage 403 so that ink droplets are discharged downward.

The pressure generator used in the "liquid discharge head" is not limited to a particular-type of pressure generator. The pressure generator is not limited to the piezoelectric actuator (or a laminated-type piezoelectric element) described in the above-described embodiments, and may be, for example, a thermal actuator that employs a thermoelectric transducer element, such as a thermal resistor or an electrostatic actuator including a diaphragm and opposed electrodes.

The terms "image formation", "recording", "printing", "image printing", and "fabricating" used herein may be used synonymously with each other.

The "liquid discharge device" is an assembly of parts relating to liquid discharge. The term "liquid discharge device" represents a structure including the head and a functional part(s) or mechanism combined to the head to form a single unit. For example, the "liquid discharge device" includes a combination of the head with at least one of a head tank, a carriage, a supply unit, a recovery device, and a main scan moving unit.

Examples of the "single unit" include a combination in which the head 1 and one or more functional parts and devices are secured to each other through, e.g., fastening, bonding, or engaging, and a combination in which one of the head 1 and the functional parts and devices is movably held by another. The head 1 may be detachably attached to the functional part(s) or unit(s) s each other.

FIG. 8 is a side view of an example of the liquid discharge device 440 in which the head 1 and the head tank 441 form the liquid discharge device 440 as a single unit. Alternatively, the head 1 and the head tank 441 coupled (connected) with a tube or the like may form the liquid discharge device 440 as a single unit. Here, a unit including a filter may further be added to a part between the head tank 441 and the head 1.

In another example, the liquid discharge device 440 may include the head 1 and the carriage 403 to form a single unit.

In still another example, the liquid discharge device 440 includes the head 1 movably held by the guide 401 that forms part of a main scan moving unit 493 (see FIG. 9), so that the head 1 and the main scan moving unit 493 form a single unit.

FIG. 9 is a plan view of an example of the liquid discharge device 440 that includes the head 1, the carriage 403, and the main scan moving unit 493 that form a single unit.

The inkjet recording apparatus 90 is a serial type apparatus, and the carriage 403 reciprocally moves in the main scanning direction as indicated by arrow MSD by the main scan moving unit 493. The main scan moving unit 493 includes a guide 401, a main scanning motor 405, a timing belt 408, and the like. The main scan moving unit 493 functions as a drive device to move the carriage in the main scanning direction MSD. The guide 401 is bridged between the left-side plate 491A and right-side plate 491B to moveably hold the carriage 403. The main scanning motor 405 reciprocally moves the carriage 403 in the main scanning direction MSD via the timing belt 408 bridged between a driving pulley 406 and a driven pulley 407.

In still another example, a cap that forms part of a recovery device 127 (see FIG. 12) may be secured to the carriage 403 mounting the head 1 so that the head 1, the carriage 403, and the recovery device 127 form a single unit to form the liquid discharge device 440.

FIG. 10 is a front view of still another example of the liquid discharge device 440. The liquid discharge device 440 includes tubes 456 connected to the head 1 mounting a channel part 444 so that the head 1 and a supply unit form a single unit. The liquid in a liquid storage source such as an ink cartridge is supplied to the head 1 through the tube 456. Further, the channel part 444 is disposed inside a cover 442. Instead of the channel part 444, the liquid discharge device 440 may include the head tank 441. A connector 443 electrically connected with the head 1 is provided on an upper part of the channel part 444.

The main scan moving unit 493 may be a guide only. The supply unit may be a tube(s) only or a loading unit only.

Further, as an example of the liquid discharge device 440, there is an ink cartridge 80 (liquid cartridge) in which the head 1 according to the present disclosure and an ink tank 82 to supply the liquid (ink) to the head 1 forms a single unit (see FIG. 11). According to the above-described embodiment, a high-quality liquid cartridge having excellent durability and reliability can be obtained.

FIG. 11 is a perspective view of an example of an ink cartridge 80. The ink cartridge 80 includes the head 1 and an ink tank 82 so that the head 1 and the ink tank 82 form a single body. Nozzles 81 are formed in a nozzle surface 310 of the head 1. The ink tank 82 supplies ink to the head 1. The ink cartridge 80 includes the head 1 and the ink tank 82 that forms a single unit. Thus, an actuator of the head 1 is made to be highly precise, highly densified, and highly reliable to improve yield and reliability of the ink cartridge 80. Thus, the head 1 according to the present disclosure can reduce a cost of the ink cartridge 80.

[Liquid Discharge Apparatus]

In the above-described embodiments, the "liquid discharge apparatus" includes the head or the liquid discharge device and drives the head to discharge liquid. The liquid discharge apparatus may be, for example, an apparatus capable of discharging liquid to a material to which liquid can adhere and an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The "liquid discharge apparatus" is not limited to an apparatus to discharge liquid to visualize meaningful images, such as letters or figures. For example, the liquid discharge apparatus may be an apparatus to form arbitrary images, such as arbitrary patterns, or fabricate three-dimensional images.

The above-described term "material on which liquid can be adhered" represents a material on which liquid is at least temporarily adhered, a material on which liquid is adhered and fixed, or a material into which liquid is adhered to permeate.

Examples of the "material on which liquid can be adhered" include recording media, such as paper sheet, recording paper, recording sheet of paper, film, and cloth, electronic part, such as electronic substrate and piezoelectric element, and media, such as powder layer, organ model, and testing cell. The "material on which liquid can be adhered" includes any material on which liquid is adhered, unless particularly limited.

Examples of the "material on which liquid can be adhered" include any materials on which liquid can be adhered even temporarily, such as paper, thread, fiber, fabric, leather, metal, plastic, glass, wood, and ceramic.

Further, "liquid" discharged from the head is not particularly limited as long as the liquid has a viscosity and surface tension of degrees dischargeable from the head. However, preferably, the viscosity of the liquid is not greater than 30 mPa·s under ordinary temperature and ordinary pressure or by heating or cooling.

Examples of the liquid include a solution, a suspension, or an emulsion that contains, for example, a solvent, such as water or an organic solvent, a colorant, such as dye or pigment, a functional material, such as a polymerizable compound, a resin, or a surfactant, a biocompatible material, such as DNA, amino acid, protein, or calcium, or an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

The "liquid discharge apparatus" may be an apparatus to relatively move the head and a material on which liquid can be adhered. However, the liquid discharge apparatus is not limited to such an apparatus. For example, the liquid discharge apparatus may be a serial head apparatus that moves the head or a line head apparatus that does not move the head.

Examples of the "liquid discharge apparatus" further include a treatment liquid coating apparatus to discharge a treatment liquid to a sheet surface to coat the sheet with the treatment liquid to reform the sheet surface and an injection granulation apparatus to discharge a composition liquid including a raw material dispersed in a solution from a nozzle to mold particles of the raw material.

FIGS. 12 and 13 illustrate an inkjet recording apparatus 90 that is an example of a liquid discharge apparatus including the head 1 or liquid discharge device 440. FIG. 12 is a perspective view of the inkjet recording apparatus 90. FIG. 13 is a side view of a mechanical section of the inkjet recording apparatus 90 of FIG. 12. The head 1 is identical to the head 1 illustrated in FIGS. 1 to 7.

The inkjet recording apparatus 90 includes a printing assembly 91 inside an apparatus body 120. The printing assembly 91 includes a carriage 98, the head 1 mounted on the carriage 98, an ink cartridge 99 to supply ink to the head 1. The carriage 98 is movable in a main scanning direction as indicated by arrow "MSD" in FIG. 12.

A sheet feeding cassette 93 (or a sheet feeding tray) capable of loading a large number of sheets 92 from a front side of the apparatus body 120 is detachably attached to the lower part of the apparatus body 120. In addition, the inkjet recording apparatus 90 includes a bypass tray 94 openable to manually feed the sheets 92. Further, the sheets 92 fed from the sheet feeding cassette 93 or the bypass tray 94 is taken in, the required image is recorded by the printing assembly 91, and then ejected to the sheet ejection tray 95 mounted on a rear side of the apparatus body 120.

The printing assembly 91 holds the carriage 98 with a main guide rod 96 and a sub-guide rod 97 so that the carriage 98 is slidable in the main scanning direction MSD. The main guide rod 96 and the sub-guide rod 97 are guides laterally bridged between left and right-side plates.

The heads 1 to discharge ink droplets of respective colors of yellow (Y), cyan (C), magenta (M), and black (Bk) are mounted on the carriage 98 so that a plurality of ink discharge ports (nozzles 6) is arrayed in a direction intersecting the main scanning direction MSD. The heads 1 are mounted on the carriage 98 such that the head 1 discharges ink droplets downward. Further, the ink cartridges 99 to supply ink of each color to the head 1 are exchangeably mounted on the carriage 98.

Each of the ink cartridges 99 includes an air communication port communicated with the atmosphere in an upper portion of each ink cartridges 99, an ink supply port in a lower portion of each ink cartridges 99 to supply ink to the head 1, and a porous body to be filled with ink inside each ink cartridge 99. The ink supplied to the head 1 is maintained at a slight negative pressure by the capillary force of the porous body in the ink cartridges 99. Although four heads 1 of respective colors are used as the head 1, the head 1 may be a single head having nozzles 6 discharging ink droplets of each color.

The carriage 98 is slidably fitted on the main guide rod 96 on the rear side (downstream side in a sheet conveyance direction) and slidably mounted on the sub-guide rod 97 on the front side (upstream side in the sheet conveyance direction). To scan the carriage 98 in the main scanning direction MSD, a timing belt 104 is stretched between a driving pulley 102 driven and rotated by a main scanning motor 101 and a driven pulley 103. The timing belt 104 is secured to the carriage 98. The carriage 98 is reciprocally moved by forward and reverse rotations of the main scanning motor 101.

The inkjet recording apparatus 90 further includes a sheet feed roller 105, a friction pad 106, a sheet guide 107, a conveyance rollers 108 and 109, and a leading end roller 110 to convey the sheet 92, which is set in the sheet feeding cassette 93, to a portion below the heads 1. The sheet feed roller 105 and the friction pad 106 separates and feeds the sheets 92 sheet by sheet from the sheet feeding cassette 93.

The sheet guide 107 guides the sheets 92. The conveyance roller 108 reverses and conveys the sheet 92 fed from the sheet feed roller 105. The conveyance roller 109 is pressed against a circumferential surface of the conveyance roller 108. The leading end roller 110 defines an angle at which the sheet 92 is fed from the conveyance rollers 108 and 109. The conveyance roller 108 is driven to rotate via a gear train by a sub-scanning motor 118.

A print receiver 111 as a sheet guide is provided to guide the sheet 92 fed from the conveyance roller 108 below the heads 1 in accordance with the movement range of the carriage 98 in the main scanning direction MSD. On a downstream side of the print receiver 111 in the sheet conveyance direction (sub-scanning direction indicated by arrow SSD in FIG. 12), the inkjet recording apparatus 90 includes a conveyance roller 112, a spur roller 113, a sheet ejection roller 114, a spur roller 115, and guides 116 and 117. The conveyance roller 112 is driven to rotate with the spur roller 113 to feed the sheet 92 in a sheet ejection direction. The sheet ejection roller 114 and the spur roller 115 further feed the sheet 92 to the sheet ejection tray 95. The guides 116 and 117 form a sheet ejection path.

In recording, the inkjet recording apparatus 90 drives the head 1 in response to image signals while moving (scanning) the carriage 98, discharges ink to the stopped sheet 92 to record one line of a desired image onto the sheet 92, and feeds the sheet 92 in a predetermined amount, and then records a next line on the sheet 92. When the inkjet recording apparatus 90 receives a signal indicating that a rear end of the sheet 92 has reached a recording area or an end of recording operation, the inkjet recording apparatus 90 terminates a recording operation and ejects the sheet 92.

Further, the recovery device 127 to recover a discharge failure of the head 1 is disposed at a position out of the recording area on a right side in the moving direction (main scanning direction MSD) of the carriage 98. The recovery device 127 includes a cap, a suction unit, and a cleaning unit. In printing standby state, the carriage 98 is moved and placed at the side in which the recovery device 127 is disposed, and the heads 1 are capped with the capping unit.

Accordingly, the nozzles 6 are maintained in a wet state, thus preventing occurrence of a discharge failure due to ink dry. The inkjet recording apparatus 90 discharges ink not relating to the recording in the middle of the recording, for example, to maintain the viscosity of ink in all of the nozzles 6 constant, thus maintaining the head 1 to stably discharge the liquid (ink).

When a discharge failure has occurred, the nozzles 6 of the heads 1 are tightly sealed with the cap, the suction unit sucks ink and bubbles, for example, from the nozzles 6 via tubes, and the cleaning unit removes ink and dust adhered to the nozzle surface 310 of the nozzles 6, thus recovering the discharge failure. The sucked ink is discharged to a waste ink container disposed on a lower portion of an apparatus body 120, and is absorbed into and retained in an ink absorber in the waste ink container. The inkjet recording apparatus 90 mounts the heads 1 manufactured by the method according to the present disclosure. Thus, the heads 1 can stably discharge the ink droplets and thus increase the image quality.

Although the above-described embodiments describe the head 1 used to the inkjet recording apparatus 90, the head 1 may be used to a device that discharges liquid other than ink, for example, a liquid resist for patterning.

EXAMPLES

Hereinafter, the present disclosure is described with reference to examples and comparative examples. However, the present disclosure is not limited to the examples as described below.

Example 1

An Examples 1 is indicated as "EX1" in Table 1.

The diaphragm 3 and the piezoelectric element 2 are formed on the actuator substrate 100 made of silicon (Si) as illustrated in FIGS. 1 to 3. Further, the interlayer insulating film 45, the connection hole 30, the wiring pattern 42, the lead wire 40, and the lead wiring pad 41 are formed on the actuator substrate 100.

Next, through holes 60 and gaps 67 were formed by a photolithographic etching method on the head substrate 200 made of silicon (Si), and the head substrate 200 and the actuator substrate 100 were bonded. Next, the actuator substrate 100 was processed by dry etching using an ICP etcher and $CF_4$ gas to form the pressure chamber 5.

Next, the $O_2$ plasma processing (50 W for five minutes) was performed in the ICP etcher to form a natural oxide film 32 having a film thickness of 3.5 nm in a portion to be a liquid channel.

Next, a surface treatment film 52 is formed by atomic layer deposition (ALD) method. A support tape was attached to a portion at which the surface treatment film 52 was not formed by the ALD method. The head substrate 200, to which the support tape was attached, was placed into an ALD chamber, and a first layer of $SiO_2$ film was formed to a film thickness of 0.1 nm.

Then, a $Ta_2O_5$ film was formed on the first layer of SiO2 film, and a $SiO_2$ film and a $Ta_2O_5$ film were alternately formed on the $Ta_2O_5$ film.

Further, the $O_3$ plasma processing (treatment) was performed for 5 minutes in the ALD chamber during the process of ALD method. The $O_3$ plasma processing (treatment) was performed during film-forming the surface treatment film 52 in ALD chamber.

After forming the surface treatment film 52, a cross-section of the surface treatment film 52 is observed by Transmission Electron Microscope (TEM), and a thickness of the natural oxide film 32 on the Si substrate was measured. At this time, Energy Dispersive X-ray Spectroscopy (EDX) analysis was performed at the interface between the natural oxide film 32 and the surface treatment film 52 to quantify the C content and F content to all elements (mainly Si, Ta, O, C, and F).

Further, the observation result in the present disclosure is illustrated in FIG. 7. Further, X-ray Photoelectron Spectroscopy (XPS) analysis was performed.

[Evaluation]
[Scratch Strength]

The scratch strength was evaluated on adhesion of the surface treatment film 52. A scratch tester (CSR-5000 manufactured by RHESCA Co., LTD.) was used to test the scratch strength. The adhesion differs according to a condition of a diamond tip (head) used to scratch the surface treatment film 52. In the evaluation, diameter of stylus was 15 μm using a spherical diamond tip. The adhesion was preferably 120 mN or more.

[Ink Immersion Test]

Regarding the ink immersion test, discharge evaluation of a head using an aqueous pigment ink (manufactured by DIC Co., LTD.). After the head was immersed in the ink for a certain period (here, for example, two days), the ejection property was evaluated.

GOOD: No discharge failure occurred.
POOR: Discharge failure occurred.

[Reliability Test]

A heat cycle test (HTC) under temperature cycles (9 cycles) from −70° C. to 30° C. were performed for the reliability test using the inkjet recording apparatus 90 as illustrated in FIGS. 12 and 13. After the HTC test, the discharge properties of the head 1 were evaluated to check presence of a defect in the head 1.

[Evaluation Criteria]
GOOD: No discharge failure occurred.
POOR: Discharge failure occurred.

Table 1 illustrates preparation conditions, measured values, and evaluation results of each example and comparative example. In Table 1, "%" means "atomic %".

TABLE 1

| | Deposition temperature (ALD) (C) | Contents of C (atomic %) | Thickness of a surface treatment film (nm) | Nozzle plate material | Scratch Strength (mN) | Ink immersion test | Reliability Test |
|---|---|---|---|---|---|---|---|
| EX1 | 180 | 18 | 50 | SUS | 150 | GOOD | GOOD |
| EX2 | 150 | 21 | 50 | SUS | 160 | GOOD | GOOD |
| EX3 | 100 | 29 | 50 | SUS | 165 | GOOD | GOOD |
| EX4 | 220 | 15 | 50 | SUS | 125 | GOOD | GOOD |
| EX5 | 180 | 19 | 50 | Si | 180 | GOOD | GOOD |
| EX6 | 220 | 15 | 70 | Si | 150 | GOOD | GOOD |
| EX7 | 220 | 15 | 30 | Si | 175 | GOOD | GOOD |
| CE1 | 350 | 8 | 100 | SUS | 55 | GOOD | POOR |
| CE2 | 60 | 45 | 20 | SUS | 110 | POOR | GOOD |

Then, it was observed that the interface between the natural oxide film 32 and the surface treatment film 52 contains TaSiOx that is a film obtained in a bonded state of Ta—Si.

Next, a natural oxide film 32 and a surface treatment film 52 were formed on the nozzle substrate 300 in which the nozzles 6 were formed under the same manufacturing conditions as described above. Subsequently, the nozzle substrate 300 is bonded to the actuator substrate 100 obtained by the above-described process by adhesive. The head 1 of the Example 1 was thus produced.

Examples 2 to 7 and Comparative Examples 1 and 2

Examples 2 to 7 were same as Example 1 except that changes were made as illustrated in Table 1 below. Examples 2 to 7 are indicated as "EX2" to "EX6" in Table 1. Further, Comparative Examples 1 and 2 are indicated as "CE1" and "CE2" in Table 1.

Table 1 shows that Examples 1 to 7 in which the amount of carbon is in a predetermined range have good scratch strength. Further, as in Examples 5 to 7, when the nozzle material is Si, which is the same as the actuator substrate, the scratch strength becomes higher. On the other hand, in Comparative Example 1 in which the amount of carbon was low, the scratch strength was low, and POOR (a defect due to peeling of the surface treatment film) occurred in reliability test. In comparative example 2 having a high carbon content, the scratch strength was not enough, and a POOR result was obtained in the ink immersion test.

What is claimed is:
1. A liquid discharge head comprising:
   a flow path former that forms a liquid flow path, and
   a surface treatment film formed on a surface of the flow path former,
   wherein an amount of carbon, which is not chemically bonded to other elements, contained in the surface treatment film is 15 atomic % to 30 atomic %.

2. The liquid discharge head according to claim 1,
wherein the surface treatment film includes at least one transition metal selected from the fourth group and the fifth group of the periodic table of elements.

3. The liquid discharge head according to claim 1,
wherein the surface treatment film includes at least one selected from Hf, Ta, and Zr.

4. The liquid discharge head according to claim 1,
wherein a film thickness of the surface treatment film is 30 nm or more and 70 nm or less.

5. The liquid discharge head according to claim 1, further comprising:
an actuator substrate having an energy generator,
and a nozzle substrate having nozzles,
wherein the actuator substrate and the nozzle substrate comprise Si.

6. The liquid discharge head according to claim 1,
wherein the surface treatment film has a Ta—Si bonding.

7. A liquid discharge device comprising the liquid discharge head according to claim 1.

8. The liquid discharge device according to claim 7, further comprising at least one of:
a head tank to store the liquid to be supplied to the liquid discharge head;
a carriage to mount the liquid discharge head;
a supplier to supply the liquid to the liquid discharge head;
a maintenance structure to maintain the liquid discharge head; and
a driver to move the carriage in a main scanning direction, together with the liquid discharge head to form a single unit.

9. A liquid discharge apparatus comprising the liquid discharge device according to claim 8.

10. The liquid discharge head according to claim 1,
wherein the amount of carbon contained in the surface treatment film is 18 atomic % to 27 atomic %.

11. The liquid discharge head according to claim 1,
wherein the surface treatment film was formed from an atomic layer deposition (ALD) process.

12. The liquid discharge head according to claim 11,
wherein the surface treatment film was formed in a low temperature region of 200° C.

13. A liquid discharge head comprising:
a flow path former that forms a liquid flow path to flow a liquid, and
a surface treatment film formed on a surface of the liquid flow path of the flow path former, the surface of the liquid flow path being in direct contact with the liquid,
wherein an amount of carbon, which is not chemically bonded to other elements, contained in the surface treatment film is 15 atomic % to 30 atomic %.

14. The liquid discharge head according to claim 13,
wherein the surface treatment film includes at least one transition metal selected from the fourth group and the fifth group of the periodic table of elements.

15. The liquid discharge head according to claim 13,
wherein the surface treatment film includes at least one selected from Hf, Ta, and Zr.

* * * * *